United States Patent [19]

Fujii

[11] Patent Number: 5,315,269
[45] Date of Patent: May 24, 1994

[54] PHASE-LOCKED LOOP

[75] Inventor: Takashi Fujii, Tokyo, Japan

[73] Assignee: NEC Corporation, Tokyo, Japan

[21] Appl. No.: 922,762

[22] Filed: Jul. 31, 1992

[30] Foreign Application Priority Data

Jul. 31, 1991 [JP] Japan .................................. 3-215878

[51] Int. Cl.$^5$ .............................................. H03L 7/00
[52] U.S. Cl. ................................... 331/1 A; 331/1 R; 331/11; 331/17
[58] Field of Search ..................... 331/1 A, 11, 14, 17, 331/25, 1 R

[56] References Cited

U.S. PATENT DOCUMENTS

| | | | |
|---|---|---|---|
| 3,571,743 | 3/1971 | Menkes | 331/11 |
| 4,888,564 | 12/1989 | Ishigaki | 331/1 A |
| 5,208,546 | 5/1993 | Nagaraj et al. | 331/17 |

FOREIGN PATENT DOCUMENTS 2194714  3/1988  United Kingdom .

OTHER PUBLICATIONS

International Journal of Electronics, vol. 56, No. 6, Jun. 1984, pp. 847-854, Nieznanski et al.

Primary Examiner—Robert J. Pascal
Assistant Examiner—Arnold Kinkead
Attorney, Agent, or Firm—Sughrue, Mion, Zinn, Macpeak & Seas

[57] ABSTRACT

A phase-locked loop according to the present invention includes first and second frequency demultipliers, and a plurality of phase/frequency detectors. The first and second frequency demultipliers divide frequency of first and second signals by a predetermined number. Each of the plurality of phase/frequency detectors compares two signals supplied from the first and second frequency demultipliers. In accordance with a comparison result of the plurality of phase/frequency detectors, phase of the second signal is adjusted to be synchronized with the first signal.

5 Claims, 5 Drawing Sheets

PHASE-LOCKED LOOP

FIELD OF THE INVENTION

This invention relates to a phase-locked loop, and more particularly to a phase-locked loop used for a jitter attenuator.

BACKGROUND OF THE INVENTION

A phase-locked loop is widely used in technical fields, such as frequency control, frequency synthesizing, FM (frequency modulation) demodulation, data recovery, signal synchronization, etc. One of the applications of the phase-locked loop is a jitter attenuator for removing jitter which is fluctuation of phase carried on a clock signal.

A first conventional phase-locked loop includes a phase/frequency detector for comparing phases between an input signal and an output signal, a loop filter for supplying a control signal in accordance with a signal supplied from the phase/frequency detector, and a voltage controlled oscillator. The voltage controlled oscillator adjusts a phase of the output signal in accordance with the control signal supplied from the loop filter in order that the input signal and the output signal are synchronized.

When a phase-locked loop is used for a jitter attenuator, it is necessary that a loop bandwidth thereof is narrower than a frequency component of jitter to be removed. Therefore, a phase difference between an input signal having jitter and output signal having no jitter becomes large. In such a phase-locked loop, it is necessary that a tracking range is wide in order to keep synchronism between an output signal and an input signal without phase slip.

Such a phase-locked loop having a wide tracking range has been proposed in a report "JITTER ATTENUATION PHASE LOCKED LOOP USING SWITCHED CAPACITOR CONTROLLED CRYSTAL OSCILLATOR" IEEE 1988 CUSTOM INTEGRATED CIRCUIT ITS CONFERENCE.

Next, a second conventional phase-locked loop shown in the above report will be explained. The second conventional phase-locked loop includes, in addition to the first conventional phase-locked loop, first and second frequency demultipliers for dividing frequency of input signal and output signal into a predetermined number (N).

According to the second conventional phase-locked loop, the divided signals are compared by a phase/frequency detector, so that tracking range of the phase-locked loop is expanded.

However, loop gain and loop bandwidth are decreased, and pull-in time is long. Further, jitter is increased at low frequencies of the output signal.

SUMMARY OF THE INVENTION

Accordingly, it is an object of the invention to provide a phase-locked loop in which tracking range can be expanded without reduction of loop gain and loop bandwidth, and pull in time is short.

It is another object of the invention to provide a phase-locked loop used for a jitter attenuator in which tracking range can be expanded without increase of output jitter at low frequencies.

According to the invention, a phase-locked loop, includes:

a first frequency demultiplier for dividing an input signal into plural input divided signals, the plural input divided signals having a predetermined phase difference from others;

A second frequency demultiplier for dividing an output signal into plural output divided signals, the plural output divided signals having the predetermined phase difference from others;

plural phase comparators each comparing phases of two corresponding input and output divided signals selected from the plural input and output divided signals;

means for adding output signals of the plural phase comparators:

a loop filter for generating a voltage control signal by receiving an output signal of the adding means; and a voltage controlled oscillator for generating a phase synchronous output signal by receiving the voltage control signal, the phase synchronous output signal being the output signal to be divided by the second demultiplier.

The other objects and features of this invention will become understood from the following description with reference to the accompanying drawings.

DESCRIPTION OF THE PREFERRED EMBODIMENTS

For better understanding the background of the present invention, the basic principle of the conventional technology is first described hereinafter with reference to FIGS. 1 to 6.

Figure 1:
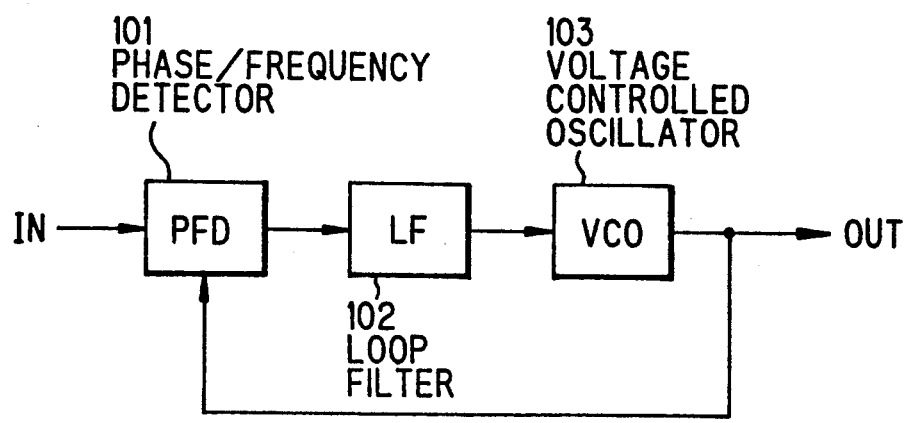
FIG. 1 is a block diagram showing a first conventional phase-locked loop.

FIG. 1 shows a first conventional phase-locked loop which includes a phase/frequency detector 101 to which an input signal "IN" is supplied, a loop filter 102 of charge pump type connected to the phase/frequency detector 101, and a voltage controlled oscillator 103 connected to the loop filter 102 and providing a loopback to the phase/frequency detector 101, wherein an output signal "OUT" of the voltage controlled oscillator 103 is supplied to the phase/frequency detector 101, and phases of the input signal "IN" and the output signal "OUT" are compared by the phase/frequency detector 101.

Figure 2:
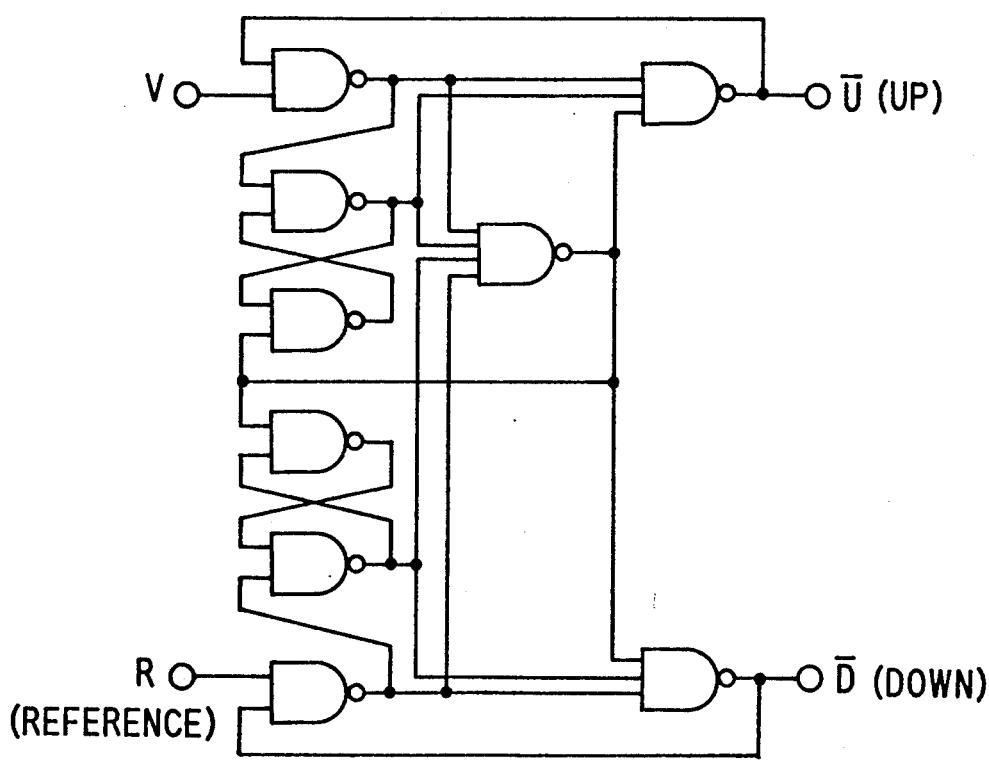
FIG. 2 is a logic circuit showing a phase/frequency detector used in the first conventional phase-locked loop.

FIG. 2 shows the phase/frequency detector 101 which includes plural NAND gates connected as shown therein, input terminals "V" and "R", and output terminals "U" and "D".

Figure 3:
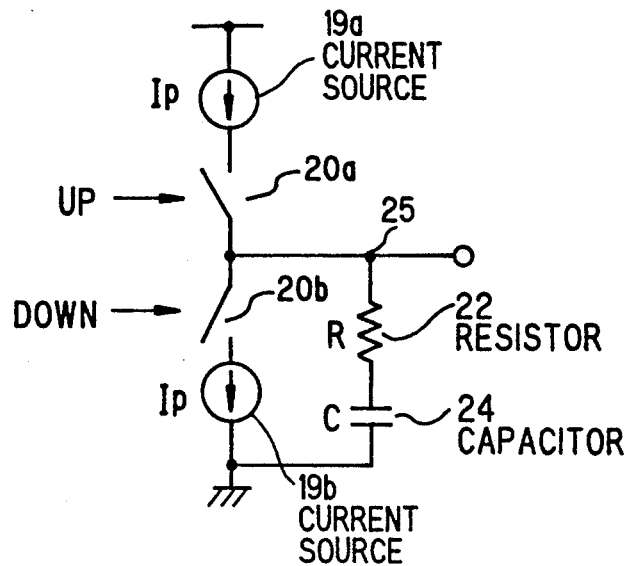
FIG. 3 is a circuit diagram showing a loop filter used in the first conventional phase-locked loop.

FIG. 3 shows the loop filter 102 which includes two current sources 19a and 19b connected to a power supply and ground, respectively, up and down switches 20a and 20b serially connected between the current sources 19a and 19b, a resistor 22 connected to a node 25, and a capacitor 24 connected between the resistor 22 and ground.

Figure 4:
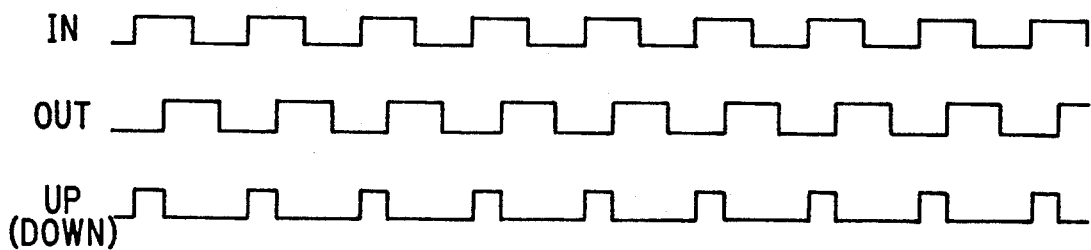
FIG. 4 is a timing chart showing operation of the first conventional phase-locked loop.

FIG. 4 shows a timing chart of the first conventional phase-locked loop. In the phase-locked loop, when phase of the output signal "OUT" precedes that of the input signal "IN", an "UP" signal is supplied from the phase/frequency detector 101 to the loop filter 102, as shown in FIG. 4. In response to the "UP" signal, the up switch 20a is turned on, so that a high level signal is supplied to the voltage controlled oscillator 103. Then, the voltage controlled oscillator 103 supplies an output signal "OUT" having a phase adjusted in accordance with the output signal of the loop filter 102.

On the other hand, when phase of the output signal "OUT" lags that of the input signal "IN", a "DOWN" signal is supplied from the phase/frequency detector 101 to the loop filter 102 (not shown in FIG. 4). In response to the "DOWN" signal, the down switch 20b is turned on, so that a low level signal is supplied to the voltage controlled oscillator 103. Then, the voltage controlled oscillator 103 supplies an output signal "OUT" having a phase adjusted in accordance with the output signal of the loop filter 102.

In the first conventional phase-locked loop, transfer function H(S) of the loop is calculated by the following expression (1).

$$H(S) = (2\xi\omega n S + \omega n^2)/(S^2 + 2\xi\omega n S + \omega n^2) \quad (1)$$

where "$\omega n$" $= (K_O I_P/2\pi C)^{\frac{1}{2}}$, and "$\xi$" $= RC\ \omega n/2$ In this expression (1), "$K_O$" means gain of the voltage controlled oscillator 103, "$I_P$" means amount of current flowing through the charge pump of the loop filter 102, "C" means a capacitance of the capacitor 24, and "R" means resistance of the resistor 22.

According to the first conventional phase-locked loop, phase of the output signal "OUT" is adjusted in accordance with an output of the phase/frequency detector 101, so that phases of the input signal "IN" and the output signal "OUT" are synchronized. However, a tracking range of the phase-locked loop is not sufficient in width for a jitter attenuator.

Figure 5:
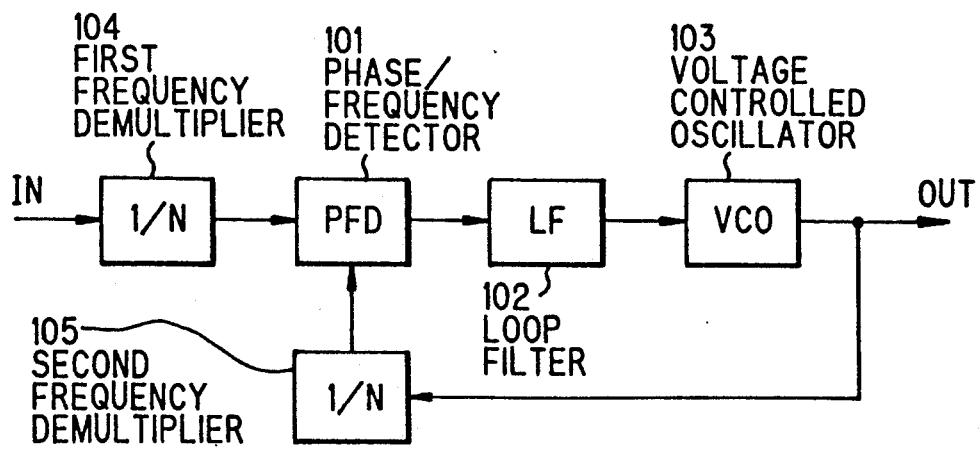
FIG. 5 is a block diagram showing a second conventional phase-locked loop.

FIG. 5 shows a second conventional phase-locked loop used for a jitter attenuator. The phase-locked loop includes a first frequency demultiplier 104 for dividing a frequency of an input signal "IN" by a predetermined number (N), a phase/frequency detector 101 connected to an output of the first frequency demultiplier 104, a loop filter 102 of charge pump type connected to an output of the phase/frequency detector 101, a voltage controlled oscillator 103 connected to an output of the loop filter 102, and a second frequency demultiplier 105 connected between an output of the voltage controlled oscillator 103 and an input of the phase/frequency detector 101. The phase/frequency detector 101 and the loop filter 102 have the same structure as those of the first conventional phase-locked loop shown in FIGS. 2 and 3, respectively.

In the second conventional phase-locked loop, frequencies of input and output signals "IN" and "OUT" are divided in the first and second frequency demultipliers 104 and 105, respectively by a predetermined number (N). And, the divided signals are compared by the phase/frequency detector 101, so that tracking range of the phase-locked loop is expanded. That is, tracking range of the phase/frequency detector 101 is $\pm 2\pi$, so that the total tracking range of the phase-locked loop becomes $\pm 2N\pi$.

Figure 6:
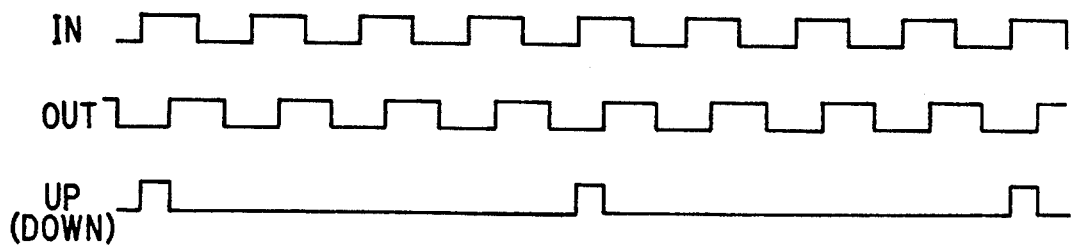
FIG. 6 is a timing chart showing operation of the second conventional phase-locked loop.

FIG. 6 shows a timing chart of the second conventional phase-locked loop, in case that each of frequency demultipliers 104 and 105 has a division ratio of $\frac{1}{4}$. In this case, the number of control signals ("UP" and "DOWN") supplied to the loop filter 102 is decreased to quarter as compared with the first conventional phase-locked loop. As a result, the decrease of the number of control signals ("UP" or "DOWN") is equivalent to a decrease of current flowing through the charge pump. Therefore, "$\omega n$" can be indicated by the following expression (2).

$$\omega n = (K_O I_P/2\pi NC)^{\frac{1}{2}} \quad (2)$$

As understood from the expression (2), loop gain and loop bandwidth are decreased, and pull-in time is largely increased.

Further, in the loop filter 102, an electric potential of "$I_P \times R$" occurs between both sides of the resistance "R" at each time when "UP" or "DOWN" signal is supplied to the loop filter 102. Therefore, a voltage of step-shaped wave is applied to the voltage controlled oscillator 103, so that the output signal "OUT" changes in step-shaped wave. The stepped change occurs synchronously with a frequency of the input signal "IN". Therefore, jitter having a basic component of 1/N in frequency of the input signal "IN" is generated in the output signal "OUT".

On the other hand, according to the first conventional phase-locked loop, jitter has a reference frequency which is the same as the input signal "IN", so that the jitter is generally negligible, excepting a particular case such as an FM demodulation circuit.

Figure 7:
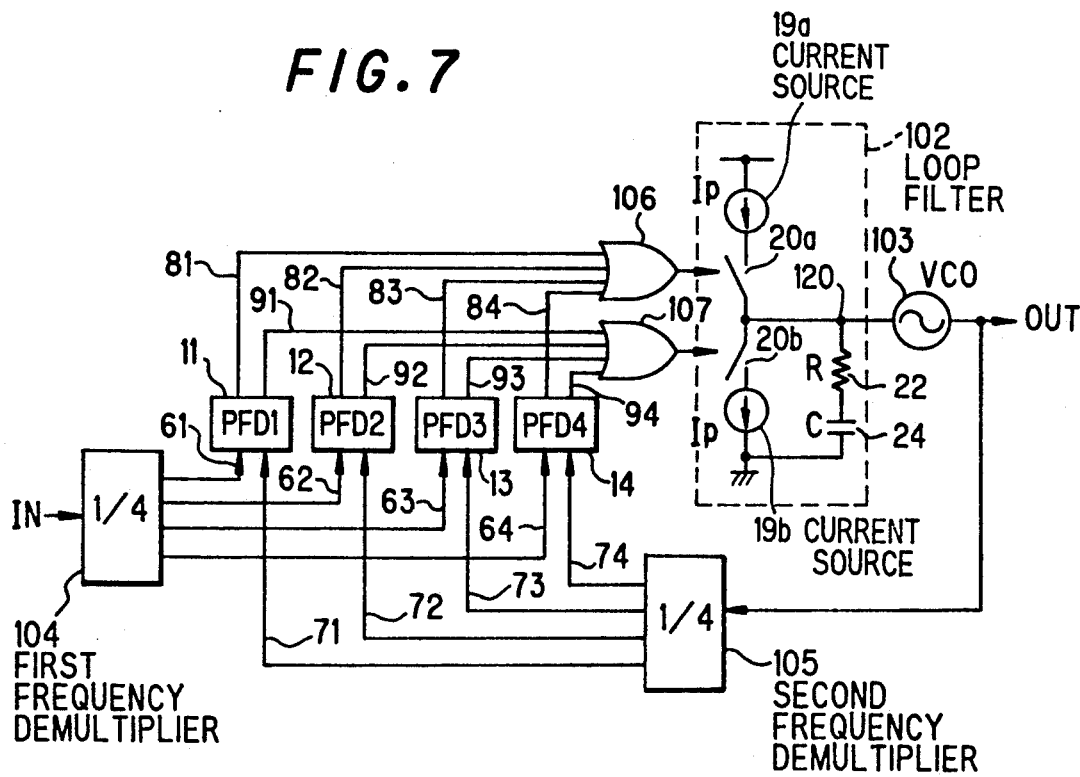
FIG. 7 is a block diagram showing a phase-locked loop of a first preferred embodiment according to the invention.

FIG. 7 shows a phase-locked loop of a first preferred embodiment according to the invention. The phase-locked loop includes a first frequency demultiplier 104 for dividing frequency of an input signal "IN" by four, four of phase/frequency detectors 11 to 14 each connected to an output of the first frequency demultiplier 104 through lines 61 to 64, two of OR gates 106 and 107 each connected to outputs of the phase/frequency detectors 11 to 14 through lines 81 to 84 and 91 to 94, a loop filter 102 of charge pump type connected to outputs of the OR gates 106 and 107, a voltage controlled oscillator 103 connected to an output of the loop filter 102, and a second frequency demultiplier 105 connected between an output of the voltage controlled oscillator 103 and inputs of the phase/frequency detectors 11 to 14 through lines 71 to 74.

In the phase-locked loop, the lines 81 to 84 are for "UP" signals, and the lines 91 to 94 are for "DOWN" signals.

The loop filter 102 includes two current sources 19a and 19b connected to a power supply and ground, respectively, up and down switches 20a and 20b serially connected between the current sources 19a and 19b, a resister 22 connected to a node 120, and a capacitor 24 connected between the resistor 22 and ground.

Figure 8:
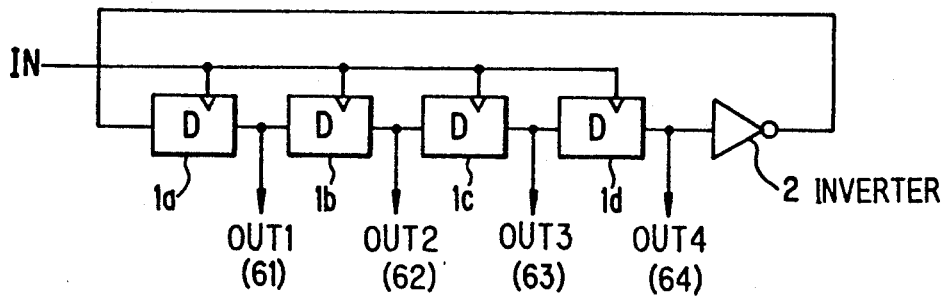
FIG. 8 is a circuit diagram showing a frequency demultiplier used in the first preferred embodiment.

FIG. 8 shows the frequency demultiplier 104 of a Johnson counter. The frequency demultiplier 104 includes four flip-flops 1a, 1b, 1c and 1d of D-type which are connected serially and supplied with the input signal "IN", an inverter 2 connected at an output of to the flip-flop 1d and at an input to the flip-flop 1a, and four output terminals "OUT1", "OUT2", "OUT3" and "OUT4". The output terminal "OUT1" is connected between the flip-flops 1a and 1b, the output terminal "OUT2" is connected between the flip-flops 1b and 1c, the output terminal "OUT3" is connected between the flip-flops 1c and 1d, and the output terminal "OUT4" is connected between the flip-flops 1d and the inverter 28, respectively. The second frequency demultiplier 105 has the same structure as the first frequency demultiplier 104.

Figure 9:
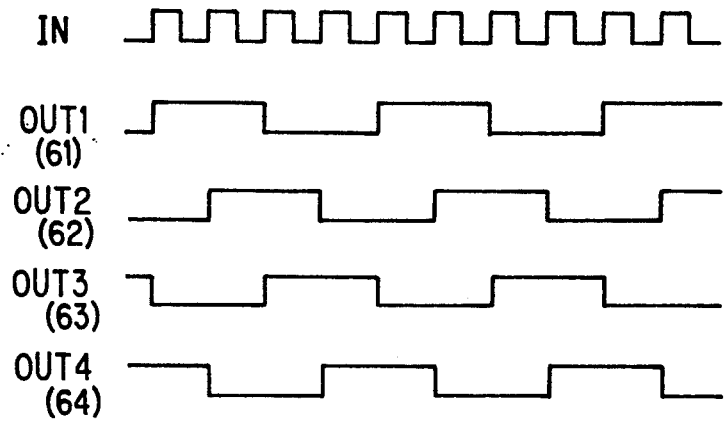
FIGS. 9 and 10 are timing charts showing operation of the first preferred embodiment, respectively.

FIG. 9 shows a timing chart of the frequency demultiplier 104. According to the frequency demultiplier 104, output signals have quarter phase difference each other. The quarter phase difference is determined to correspond to one period of the input signal "IN".

Figure 10:
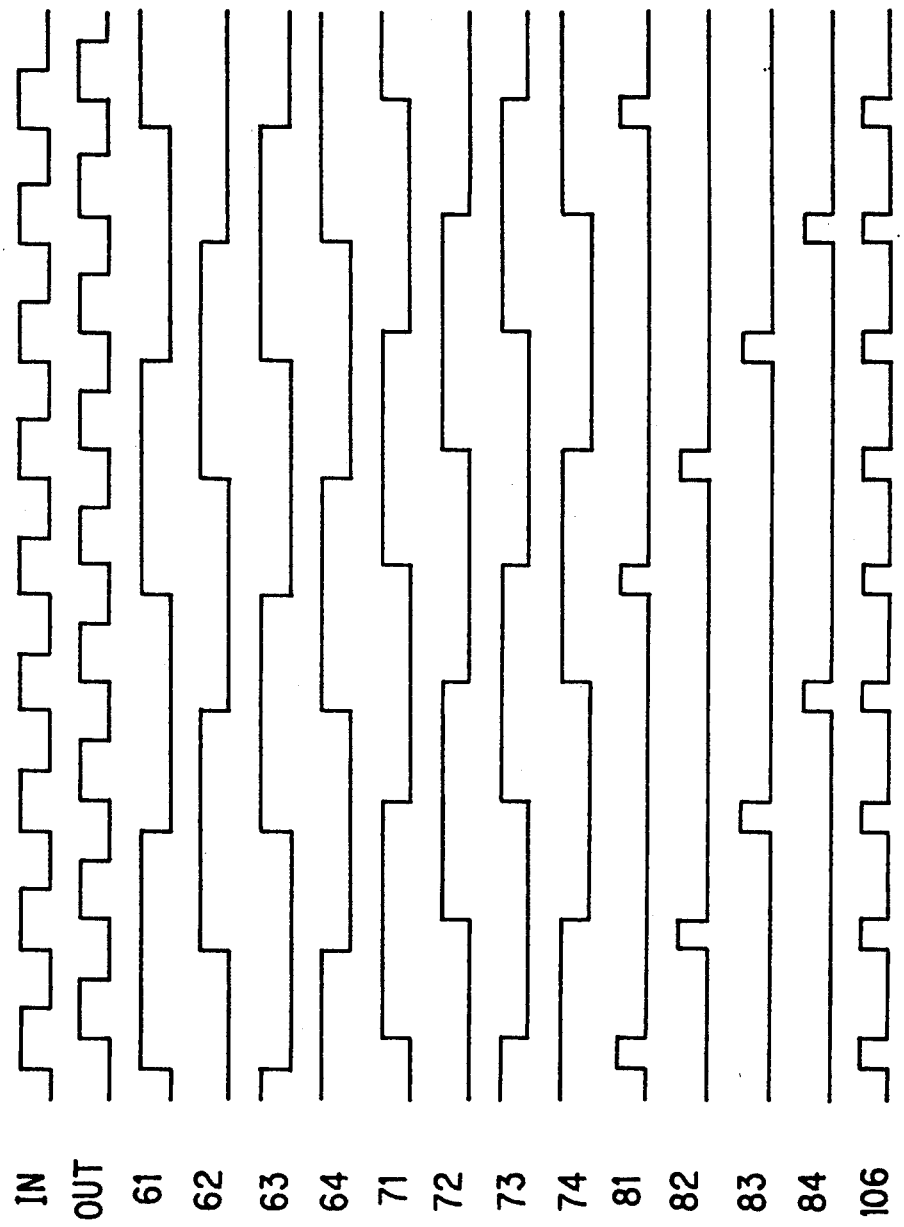

FIG. 10 shows a timing chart of the phase-locked loop of the first preferred embodiment.

In the first preferred embodiment, frequency of the input signal "IN" is divided by four, and the divided signals are supplied to the phase/frequency detectors 11 to 14, respectively. And, frequency of the output signal "OUT" is divided by four, and the divided signals are supplied to the phase/frequency detectors 11 to 14, respectively. In each of the phase/frequency detectors 11 to 14, frequencies of the two supplied signals are compared, and "UP" or "DOWN" signal is supplied to the OR gates 106 or 107.

At this time, when at least one "UP" signal is supplied to the OR gate 106, a high level signal is supplied to the UP switch 20a, so that the switch 20a is turned on. Therefore, high level signal is supplied to the voltage controlled oscillator 103, and the output signal "OUT" of a phase corresponding to the applied voltage is supplied to the second frequency demultiplier 105.

On the other hand, when at least one "DOWN" signal is supplied to the OR gate 107, a high level signal is supplied to the DOWN switch 20b, so that the switch 20b is turned on. Therefore, low level signal is supplied to the voltage controlled oscillator 103, and the output signal "OUT" of a phase corresponding to the applied voltage is supplied to the second frequency demultiplier 105. Thus, a phase of the output signal "OUT" is adjusted, so that phase of the output signal "OUT" is synchronized with a phase of the input signal "IN".

According to the first preferred embodiment, though input and output frequencies are divided by the frequency demultipliers 104 and 105, the number of phase comparison between the input signal "IN" and the output signal "OUT" is not decreased. That is, the loop characteristics such as loop gain, loop bandwidth, pull-in time, etc. do not become worse. Further, in the first preferred embodiment, output jitter has a frequency of the input signal "IN" as a reference frequency, so that the jitter does not occur at high frequencies of the output signal "OUT".

Figure 11:
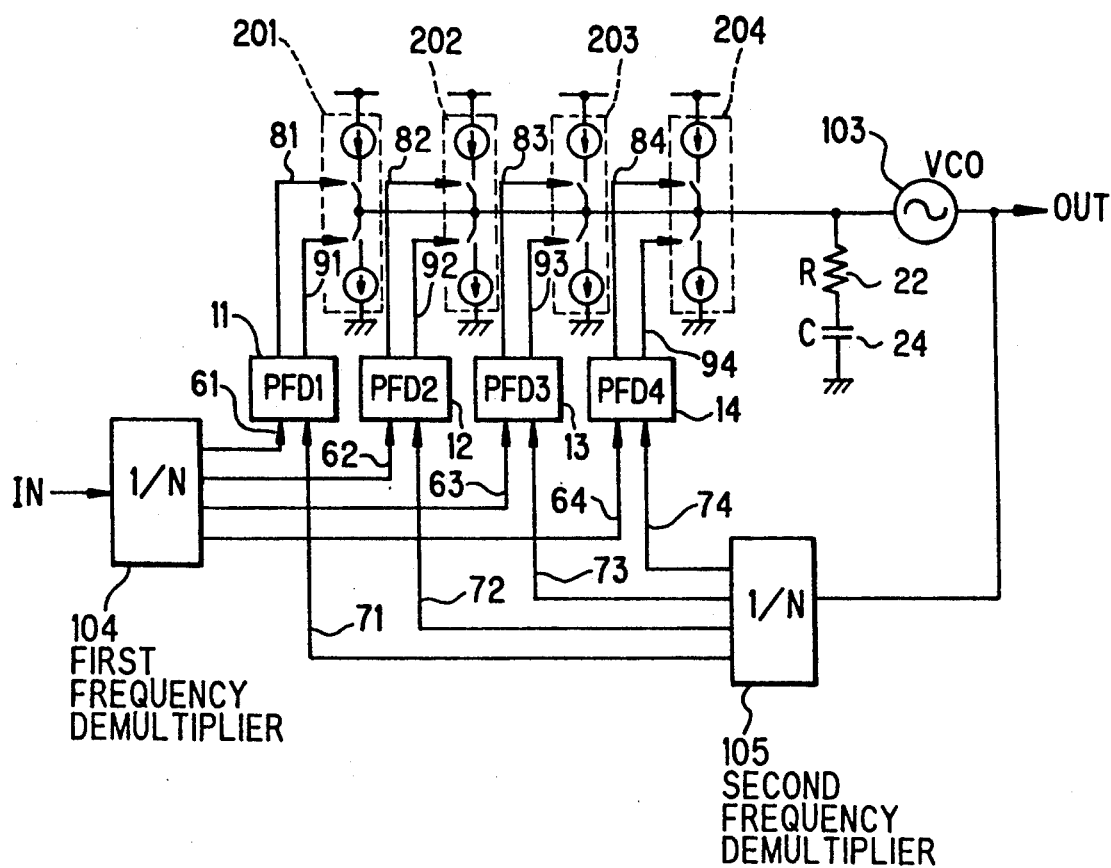
FIG. 11 is a block diagram showing a phase-locked loop of a second preferred embodiment according to the invention.

FIG. 11 shows a phase-locked loop of a second preferred embodiment according to the invention, wherein like parts are indicated by like reference numerals, as used in FIG. 7. The phase-locked loop is provided with four charge pumps 201 to 204 which are supplied with "UP" and "DOWN" signals from phase/frequency demultipliers 11 to 14, respectively.

In the second preferred embodiment, outputs of the charge pumps 201 to 204 are summed in current, and the summed current is supplied to a loop filter including a resistor 22 and a capacitor 24, a terminal voltage of which is applied to a voltage controlled oscillator 103.

According to the second preferred embodiment, each of "UP" and "DOWN" signals is summed after being converted from pulse to current, so that loop gain is constant during a state where the phase difference is zero to $2N\pi$. On the other hand, according to the first preferred embodiment, outputs 81 to 84 (91 to 94) of the phase/frequency detector 11 to 14 are overlapped one another, in that case a phase difference between the input signal "IN" and the output signal "OUT" is over $\pm 2\pi$, so that UP (DOWN) signal is supplied from the OR gate 106 (107) continuously. Consequently, even if the phase difference is increased more than $\pm 2\pi$, current flowing through the charge pump is not increased in proportion to the increase of the phase difference, so that a loop gain is reduced.

Although the invention has been described with respect to specific embodiment for complete and clear disclosure, the appended claims are not to be thus limited but are to be construed as embodying all modification and alternative constructions that may occur to one skilled in the art which fairly fall within the basic teaching herein set forth.

That is, for instance, an exclusive logic circuit and a multiplier may be used as a phase comparator, a low-pass filter of active or passive type having a resistor and a capacitor may be used as a loop filter, and a binary counter may be used as a frequency divider.

What is claimed is:

1. A phase-locked loop, comprising:
a first frequency demultiplier for dividing an input signal into first to $N^{th}$ input divided signals, each of said first to $N^{th}$ input divided signals having a predetermined phase difference relative to an input divided signal of an order subsequent thereto where N is an integer equal to or greater than two;
a second frequency demultiplier for dividing an output signal into first to $N^{th}$ output divided signals, each of said first to $N^{th}$ output divided signals having said predetermined phase difference relative to an output divided signal of an order subsequent thereto;
first to $N^{th}$ phase comparators each comparing two phases between two corresponding first to $N^{th}$ input and first to $N^{th}$ output divided signals to provide a first or second phase difference signal dependent on a comparing result of said two phases;
a first gate circuit for passing said first phase difference supplied from each of said first to $N^{th}$ phase comparators;
a second gate circuit for passing said second phase difference signal supplied from said each of said first to $N^{th}$ phase comparators;
a loop filter for generating a voltage control signal which is increased in level by receiving said first phase difference signal passed through said first gate circuit, and decreased in level by receiving said second phase difference signal passed through said second gate circuit; and
a voltage controlled oscillator for generating a phase synchronous output signal by receiving said voltage control signal, said phase synchronous output signal being said output signal to be divided into said first to $N^{th}$ output divided signals.

2. A phase-locked loop, according to claim 1 wherein:

each of said first and second frequency demultipliers is a Johnson counter.

3. A phase-locked loop according to claim 1, wherein:

said loop filter comprises a charge pump.

4. A phase-locked loop, according to claim 3, wherein said first gate circuit comprises an OR gate, and said second gate circuit comprises an OR gate.

5. A phase-locked loop comprising:

a first frequency demultiplier for dividing an input signal into first to $N^{th}$ input divided signals, each of said first to $N^{th}$ input divided signals having a predetermined phase difference relative to an input divided signal of an order subsequent thereto where N is an integer equal to or greater than two;

a second frequency demultiplier for dividing an output signal into first to $N^{th}$ output divided signals, each of said first to $N^{th}$ output divided signals having said predetermined phase difference relative to an output divided signal of an order subsequent thereto;

first to $N^{th}$ phase comparators each comparing two phases between two corresponding first to $N^{th}$ input and first to Nth output divided signals to provide a first or second phase difference signal dependent on a comparing result of said two phases;

a gate circuit for passing a phase difference signal supplied from each of said first to $N^{th}$ phase comparators;

first to $N^{th}$ phase charge pumps, each receiving said first or second phase difference signal from a corresponding one of said first to $N^{th}$ phase comparators and each outputting a current according to said first or second phase difference signals;

a loop filter for generating a voltage control signal according to a sum of said currents;

a voltage controlled oscillator for generating a phase synchronous output signal by receiving said voltage control signal, said phase synchronous output signal being said output signal to be divided into said first to $N^{th}$ output divided signals.

* * * * *